United States Patent
Ma

(10) Patent No.: US 6,648,656 B1
(45) Date of Patent: Nov. 18, 2003

(54) RETAINER DEVICE FOR ELECTRONIC PACKAGE

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/304,418

(22) Filed: Nov. 25, 2002

(30) Foreign Application Priority Data

Jun. 13, 2002 (TW) .................................. 91208818 A

(51) Int. Cl.[7] .............................................. H01R 12/00
(52) U.S. Cl. ........................................ 439/73; 439/331
(58) Field of Search .................................. 439/73, 331

(56) References Cited

U.S. PATENT DOCUMENTS

| | | | | |
|---|---|---|---|---|
| 5,344,334 A | * | 9/1994 | Laub et al. ................. 439/331 |
| 5,602,719 A | * | 2/1997 | Kinion ........................ 361/704 |
| 5,647,756 A | * | 7/1997 | Twigg et al. ................ 439/331 |
| 6,015,301 A | * | 1/2000 | Brodsky et al. ............... 439/73 |
| 6,244,875 B1 | * | 6/2001 | McHugh et al. .............. 439/73 |
| 6,282,093 B1 | * | 8/2001 | Goodwin ..................... 361/704 |

* cited by examiner

*Primary Examiner*—Gary Paumen
*Assistant Examiner*—James R. Harvey
(74) *Attorney, Agent, or Firm*—We Te Chung

(57) ABSTRACT

A retainer device for an electronic package (2) includes a frame (16), a clip (10) and a lever (18). The clip includes two spaced tabs (1020) at a first beam (102) thereof, a tongue (1040) at a second beam (104) thereof, and two pressing arms (1060, 1080) at a third beam (106) and a fourth beam (108) thereof. The tabs of the clip are pivotably attached to the frame by a pin (20). The tongue has a driving hook (1042). The frame defines two locating slots (166, 168). The lever includes two locating portions (182) pivotably received in the locating slots, a driving portion (180) between the locating portions, and a handle portion (184).

1 Claim, 7 Drawing Sheets

RETAINER DEVICE FOR ELECTRONIC PACKAGE

BACKGROUND OF THE INVENTION

1. Field of the Invention

The present invention relates to retention of electronic packages in electrical devices, and more particularly to a retainer device for retaining an electronic package such as an integrated circuit chip in a device such as a computer.

2. Description of the Related Art

A conventional retainer device for securing a central processing unit (CPU) on a land grid array (LGA) connector or socket that is mounted on a printed circuit board (PCB) commonly includes clamp mechanisms attached on the surface of the LGA connector or socket. A typical such retainer device utilizes a plurality of screws to mount the clamp mechanisms, the CPU, the LGA connector and the PCB together. Each screw is individually adjusted to provide proper biasing of the retainer device within the LGA connector. However, it is still difficult to provide uniform pressure as between the CPU, the LGA connector and the PCB. In addition, the retainer device is unduly difficult to assemble due to its numerous parts and the precise alignment required.

Another kind of retainer device for an electronic package is disclosed in U.S. Pat. No. 6,282,093. The retainer device includes a spring assembly that mate with corresponding posts of a backing plate. The backing plate is at a bottom side of a PCB, and an LGA socket is mounted directly to a top side of the PCB. The posts of the backing plate extend through the PCB, and beams of the spring assembly are secured to the posts. The retainer device does not, however, provide very high retention force. In addition, the retainer device is unduly laborious to install.

SUMMARY OF THE INVENTION

Accordingly, an object of the present invention is to provide a retainer device for securely retaining an electronic package on a socket.

In order to achieve the above object, a retainer device for an electronic package in accordance with the present invention includes a rectangular frame having a first side and a second side opposite to the first side, a rectangular metal clip rotatably mounted to the first side of the frame by an elongated pin, and a lever rotatably mounted to the second side of the frame.

The clip comprises a pair of opposite first and second beams, and a pair of opposite third and fourth beams. A pair of generally circular tabs is perpendicularly bent from opposite ends of the first beam. Each tab defines a pivot hole therein. A tongue having a driving hook at a free end thereof extends perpendicularly from the second beam. A pair of pressing arms is perpendicularly bent from opposing edges of the third and fourth beams, for pressing the electronic package on a socket. The frame includes a pair of spaced first posts at the first side thereof, and a pair of spaced second posts at the second side thereof. A pair of locking holes is defined in the first posts, and a pair of locating slots is defined in the second posts. The pin is received in the locking holes of the first posts and the pivot holes of the clip, thus rotatably attaching the clip to the frame. The lever includes a pair of locating portions pivotably received in the locating slots, a driving portion between the locating portions, and a handle portion extending perpendicularly from one of the locating portions. When the lever is rotated from a release position to a closed position, the driving portion of the lever drives the driving hook of the clip downwardly, so that the pressing arms of the clip firmly press the electronic package on the socket. In order to achieve the above object, a retainer device for an electronic package in accordance with the present invention includes a rectangular frame having a first side and a second side opposite to the first side, a rectangular metal clip rotatably mounted to the first side of the frame by an elongated pin, and a lever rotatably mounted to the second side of the frame.

Other objects, advantages and novel features of the invention will become more apparent from the following detailed description when taken in conjunction with the accompanying drawings, in which:

DESCRIPTION OF THE PREFERRED EMBODIMENTS

Reference will now be made in detail to the preferred embodiments of the present invention.

Figure 1:
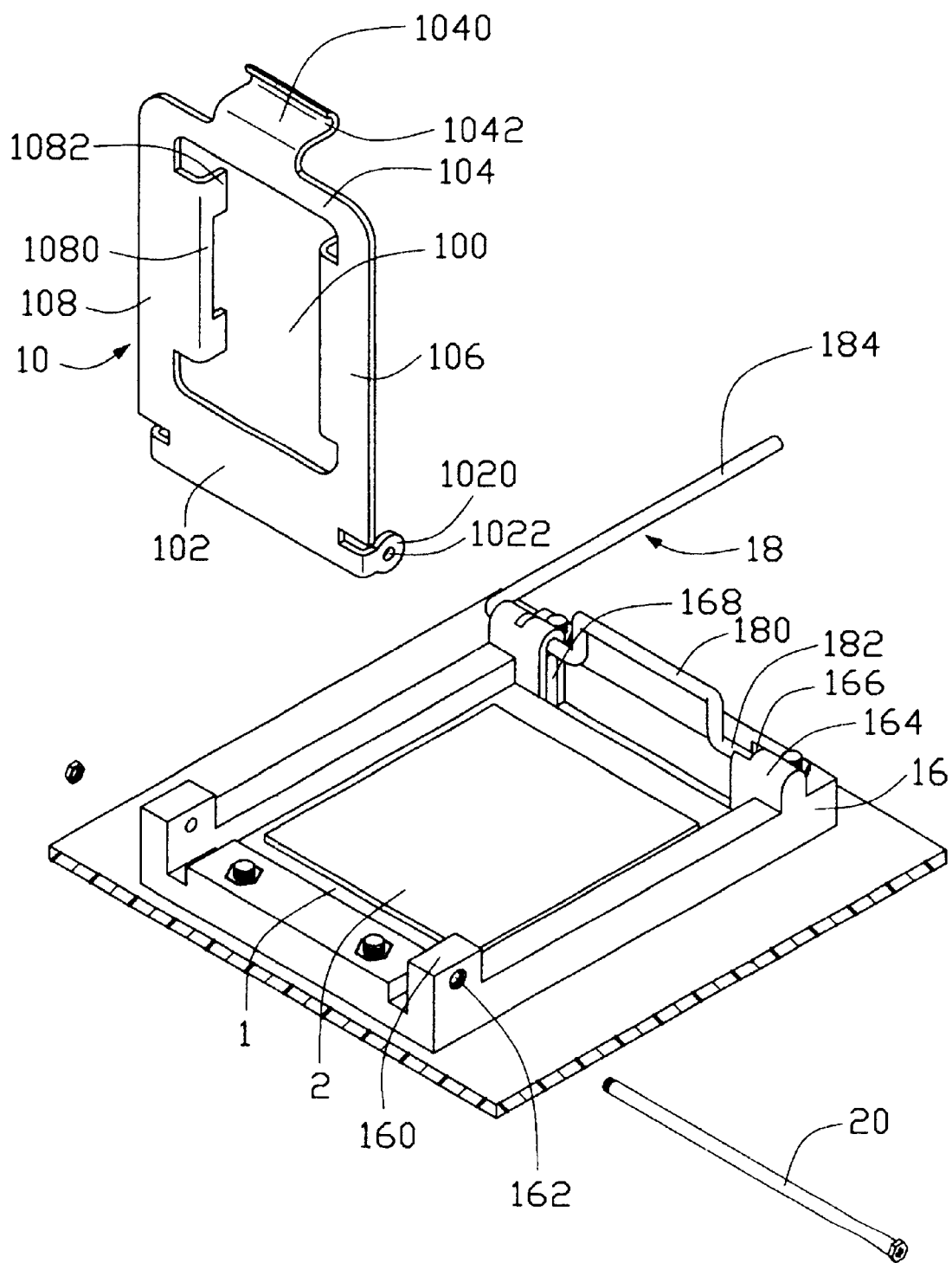
FIG. 1 is an exploded, isometric view of a retainer device in accordance with a preferred embodiment of the present invention, together with a CPU mounted on a socket on a PCB.
Figure 2:
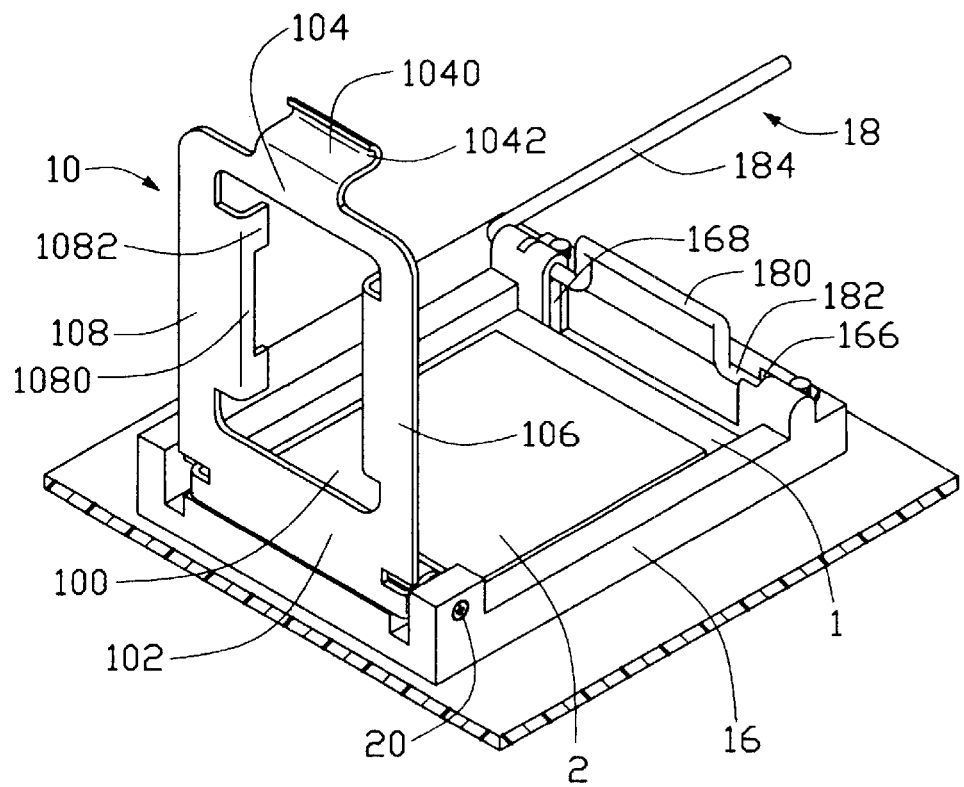
FIG. 2 is an assembled view of FIG. 1, showing a lever of the retainer device in a release position.
Figure 3:
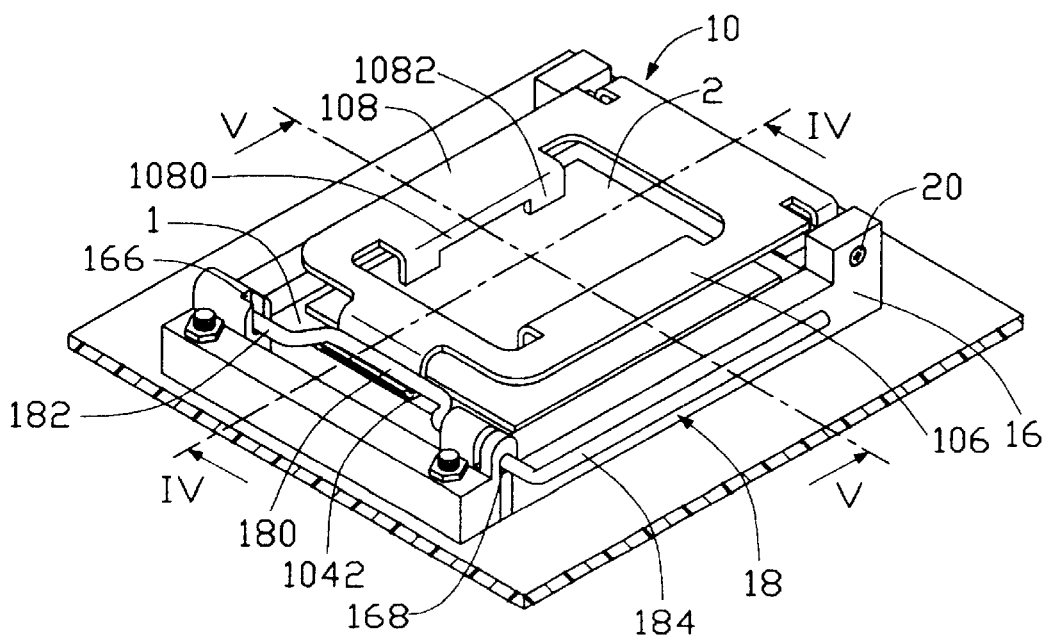
FIG. 3 is similar to FIG. 2, but viewed from another aspect and showing the lever of the retainer device in a locked position.
Figure 4:
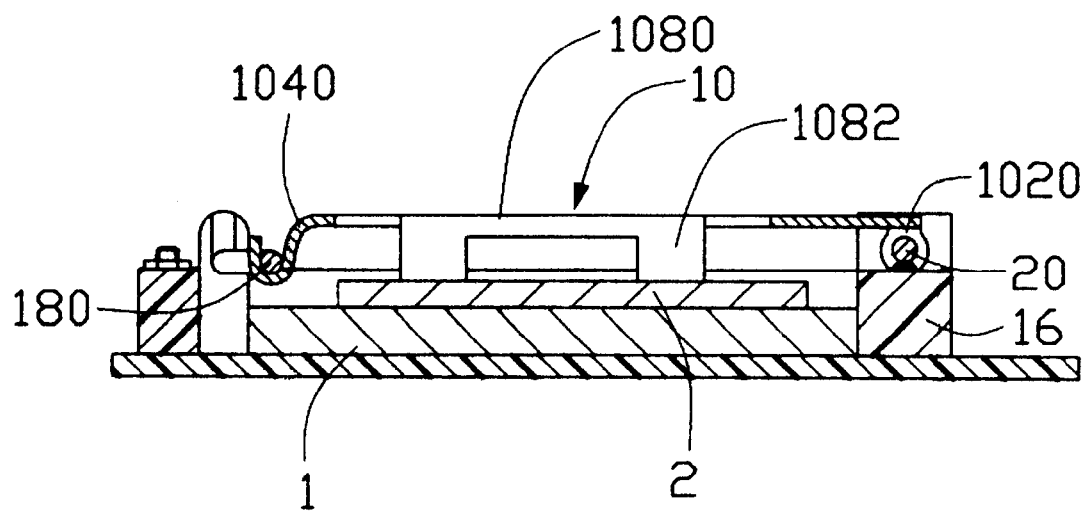
FIG. 4 is a cross-sectional view taken along line IV—IV of FIG. 3.
Figure 5:
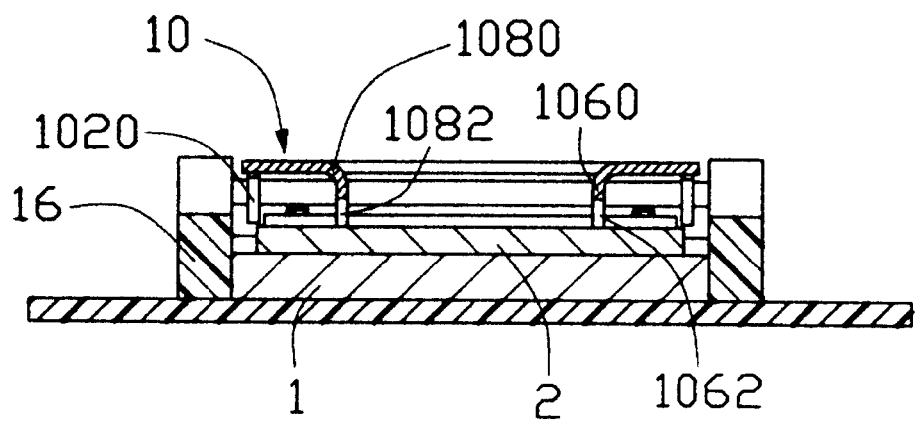
FIG. 5 is a cross-sectional view taken along line V—V of FIG. 3.

Referring to FIGS. 1, 2 and 5, a retainer device in accordance with a preferred embodiment of the present invention is for attaching a central processing unit (CPU) 2 to a land grid array (LGA) socket 1 that is mounted on a printed circuit board (PCB) (not labeled). The retainer device includes a rectangular insulative frame 16, a metal clip 10 and a lever 18 rotatably mounted to the frame 16. The socket 1 has a plurality of land grid array contacts disposed therein. The CPU 2 is mounted on the socket 1, which is surrounded by the frame 16.

The clip 10 is generally rectangular, and includes first, second, third and fourth beams 102, 104, 106, 108 surrounding a central opening 100. The first and second beams 102, 104 are at respective opposite short sides of the clip 10, and the third and fourth beams 106, 108 are at respective opposite long sides of the clip 10. A pair of generally circular tabs 1020 is perpendicularly bent from opposite ends of the first beam 102 respectively. Each circular tab 1020 defines a pivot hole 1022 therein. A tongue 1040 extends perpendicularly from a middle portion of the second beam 104. A driving hook 1042 is formed at a distal end of the tongue 1040. The driving hook 1042 has a U-shaped profile. A pair of pressing arms 1060, 1080 is perpendicularly bent from respective edges of the third and fourth beams 106, 108 at the opening 100. A pair of spaced fixing portions 1062 coplanarly extends from respective opposite ends of a distal edge of the pressing arm 1060. A pair of spaced fixing portions 1082 coplanarly extends from respective opposite ends of a distal edge of the pressing arm 1080.

The frame 16 has a pair of spaced first posts 160 extending upwardly from two corners respectively at a first side thereof. Each first post 160 defines a locking hole 162, corresponding to a respective one of the pivot holes 1022 of the clip 10. An elongate pin 20 is for extending through the pivot and locking holes 1022, 162 to pivotably attach the clip 10 to the frame 16.

The frame 16 also has a pair of spaced second posts 164 extending upwardly from two corners respectively at a second side thereof that is opposite to the first side. Two vertical locating slots 166, 168 are respectively defined in the posts 164. The lever 18 has a pair of locating portions 182 respectively received in the locating slots 166, 168, for rotatably attaching the lever 18 to the frame 16. The lever 18 also has a driving portion 180 between the two locating portions 182, and a handle portion 184 extending perpendicularly from one of the locating portions 182.

Referring to FIGS. 1 to 5, in assembly, the lever 18 is rotatably attached to the frame 16. The clip 10 is rotatably mounted to the frame 16 with the pin 20. The clip 10 is oriented vertically, to allow the CPU 2 to be attached on the socket 1. At this stage, the lever 18 is located at a release position. In this release position, the handle portion 184 is at a horizontal position extending away from the clip 10, and the driving portion 180 is at a highest position (see FIG. 2). The clip 10 is then rotated down to a closed position, with the fixing portions 1062, 1082 of the pressing arms 1060, 1080 abutting the CPU 2. The handle portion 184 of the lever 18 is rotated upwardly and then downwardly, to cause the driving portion 180 to engage with the driving hook 1042 of the clip 10. The handle portion 184 is continued to be rotated, and the driving portion 180 drives the driving hook 1042 to press the fixing portions 1062, 1082 of the pressing arms 1060, 1080 firmly against the CPU 2. At this stage, the lever 18 is located at a locked position. In this locked position, with the handle portion 184 is at a horizontal position beside the clip 10 (see FIG. 3). The clip 10 firmly presses the CPU 2 on the socket 1 (see FIGS. 4 and 5).

Figure 6:
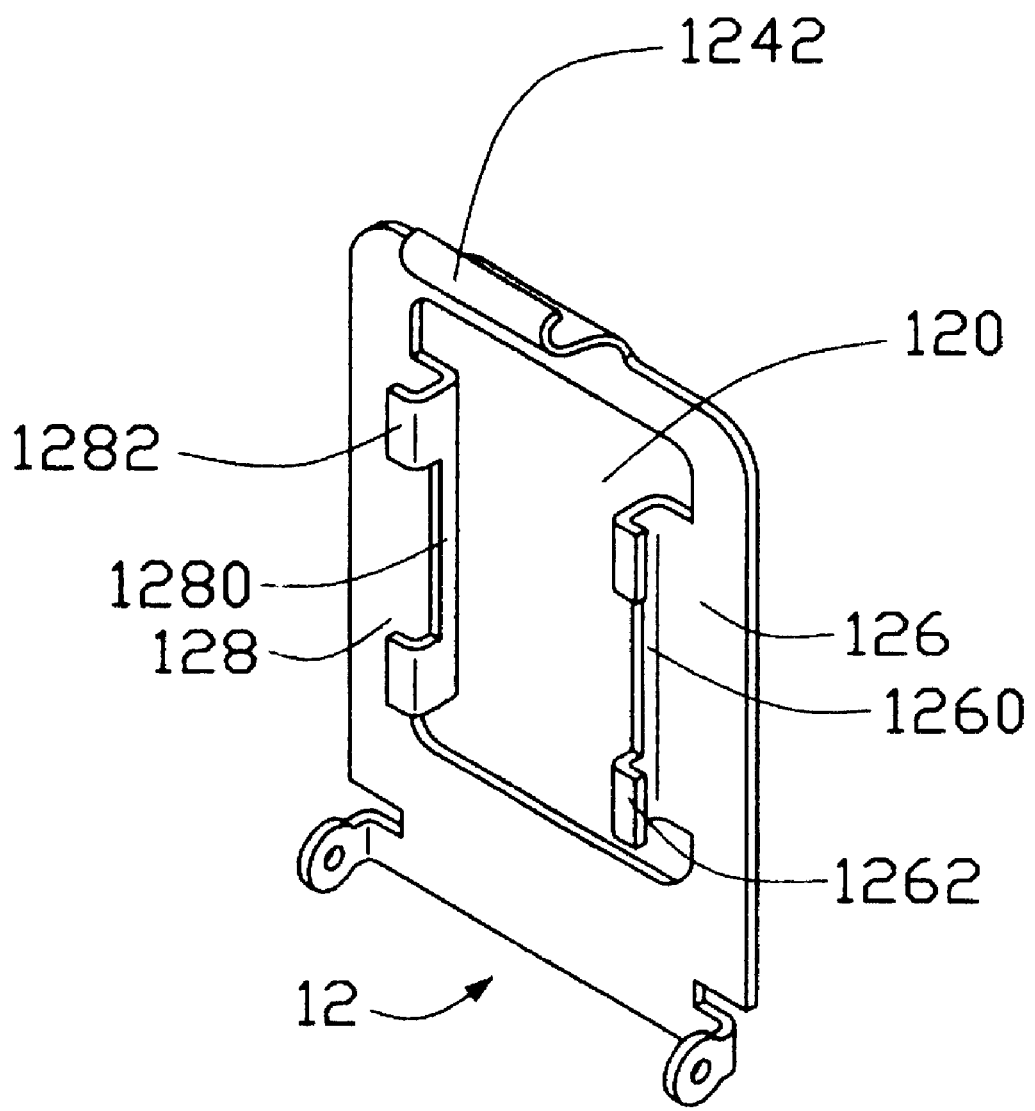
FIG. 6 is a perspective view of a clip of a retainer device in accordance with an alternative embodiment of the present invention.
Figure 7:
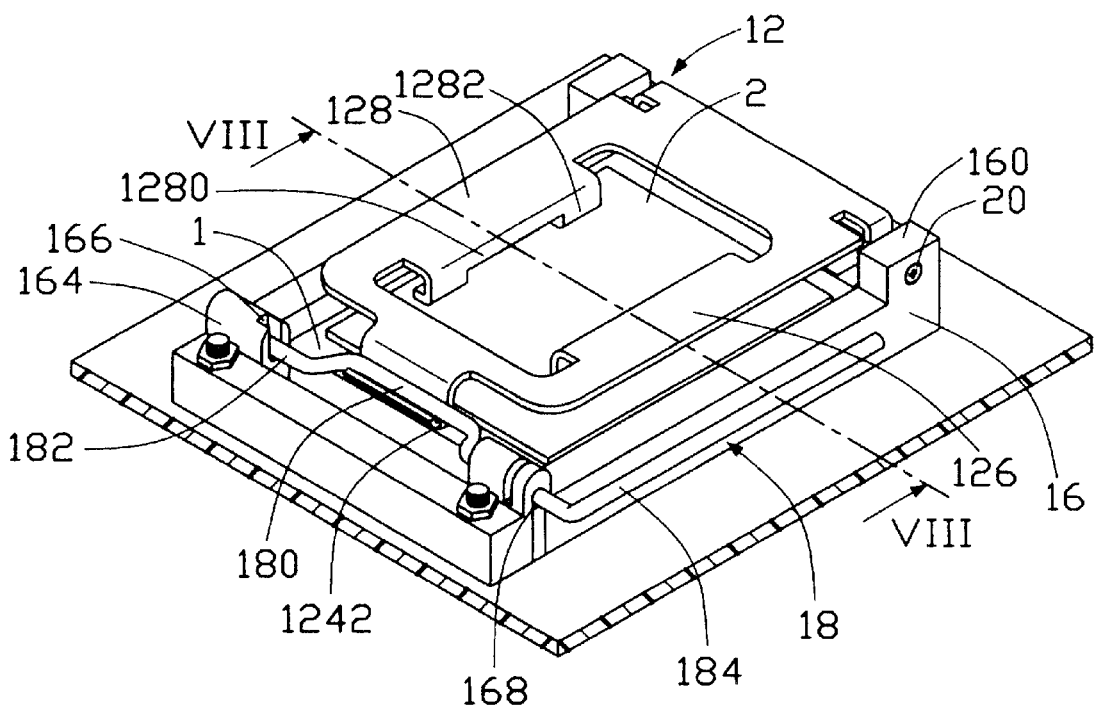
FIG. 7 is an assembled, isometric view of the retainer device in accordance with the alternative embodiment of the present invention together with a CPU mounted on a socket on a PCB, showing a lever of the retainer device in a locked position.
Figure 8:
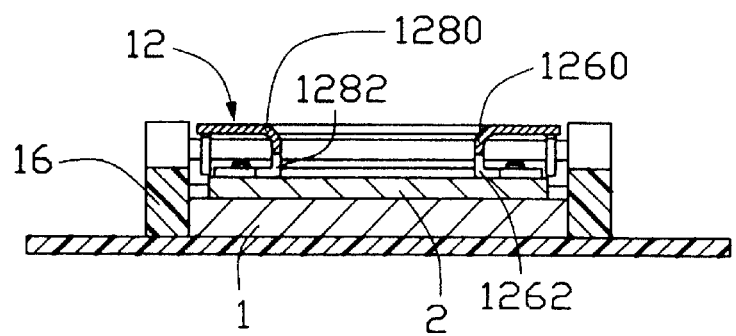
FIG. 8 is a cross-sectional view taken along line VIII—VIII of FIG. 7.

FIGS. 6, 7 and 8 show a clip 12 in accordance with an alternative embodiment of the present invention. A pair of pressing arms 1260, 1280 is perpendicularly bent from respective edges of third and fourth beams 126, 128 at opposite sides of a central opening 120. A pair of spaced fixing portions 1262 extends from respective opposite ends of a distal edge of the pressing arm 1260. A pair of spaced fixing portions 1282 extends from respective opposite ends of a distal edge of the pressing arm 1280. The fixing portions 1262, 1282 each have an L-shaped profile, and the pair of fixing portions 1262 is oriented symmetrically opposite the pair of fixing portions 1282. The fixing portions 1262, 1282 are formed to provide a large contact area between the clip 12 and the CPU 2. When the handle portion 184 of the lever 18 is rotated, the driving portion 180 drives a driving hook 1242 of the clip 12 to press the fixing portions 1262, 1282 of the pressing arms 1260, 1280 firmly against the CPU 2 on the socket 1.

Figure 9:
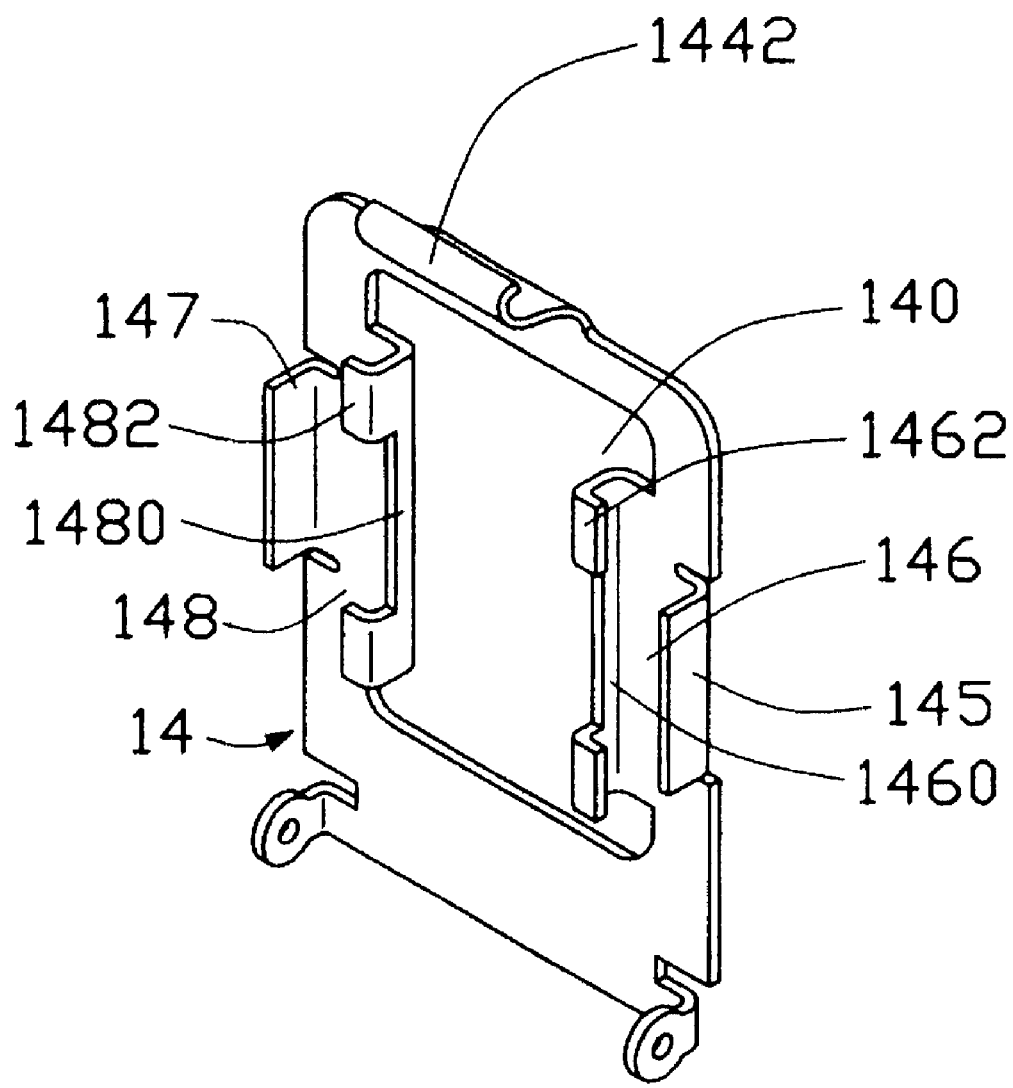
FIG. 9 is a perspective view of a clip of a retainer device in accordance with a further alternative embodiment of the present invention.
Figures 10, 11:
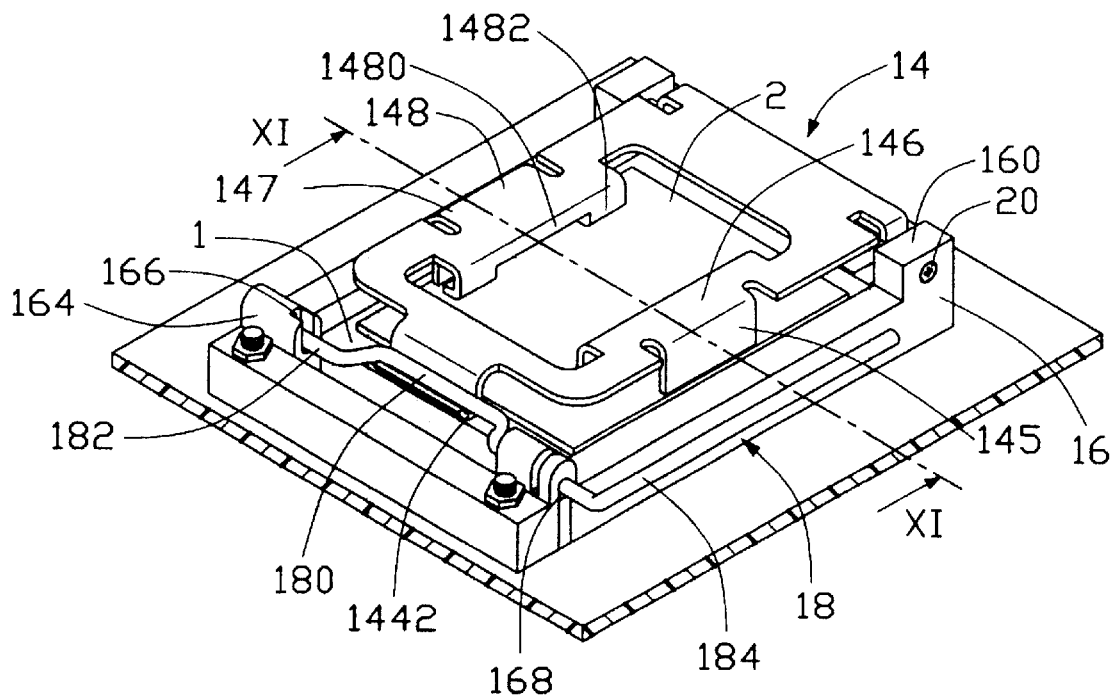
FIG. 10 is an assembled, isometric view of the retainer device in accordance with the further alternative embodiment of the present invention together with a CPU mounted on a socket on a PCB, showing a lever of the retainer device in a locked position.
FIG. 11 is a cross-sectional view taken along line XI—XI of FIG. 10.

FIGS. 9, 10 and 11 show a clip 14 in accordance with a further alternative embodiment of the present invention. A pair of pressing arms 1460, 1480 is perpendicularly bent from respective edges of third and fourth beams 146, 148 at opposite sides of a central opening 140. A pair of spaced fixing portions 1462 extends from respective opposite ends of a distal edge of the pressing arm 1460. A pair of spaced fixing portions 1482 extends from respective opposite ends of a distal edge of the pressing arm 1480. The fixing portions 1462, 1482 each have an L-shaped profile, and the pair of fixing portions 1462 is oriented. symmetrically opposite the pair of fixing portions 1482. The fixing portions 1462, 1482 are formed to provide a large contact area between the clip 14 and the CPU 2. Further, a pair of pressing arms 145, 147 is perpendicularly bent from respective outside edges of the third and fourth beams 146, 148. When the handle portion 184 of the lever 18 is rotated, the driving portion 180 drives a driving hook 1442 of the clip 14 to press the fixing portions 1462, 1482 and the pressing arms 145, 147 firmly against the CPU 2 on the socket 1 at the same time.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retainer device for an electronic package, comprising:
    a frame for surrounding a land grid array socket on which the electronic package is mounted, the frame having a first side and a second side opposite to the first side;
    a clip comprising a first beam pivotably mounted to the first side of the frame, a second beam having a driving portion formed thereat, and a third beam comprising a pressing arm perpendicularly bent from an edge thereof; and
    a lever pivotably mounted to the second side of the frame and engaging with the driving portion to drive the pressing arm to press the electronic package against the socket.

\* \* \* \* \*